(12) United States Patent
Fromson et al.

(10) Patent No.: US 8,785,109 B2
(45) Date of Patent: *Jul. 22, 2014

(54) METHOD OF DEVELOPING A LITHOGRAPHIC PRINTING PLATE INCLUDING POST HEATING

(75) Inventors: Howard A. Fromson, Stonington, CT (US); William J. Ryan, North Granby, CT (US)

(73) Assignee: Anocoil Corporation, Rockville, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/413,280

(22) Filed: Mar. 6, 2012

(65) Prior Publication Data

US 2012/0186474 A1 Jul. 26, 2012

Related U.S. Application Data

(63) Continuation-in-part of application No. 12/799,568, filed on Apr. 27, 2010, now Pat. No. 8,137,897, which is a continuation-in-part of application No. 12/586,764, filed on Sep. 28, 2009, now Pat. No. 8,133,658.

(51) Int. Cl.
*B41M 5/00* (2006.01)
*B41N 1/00* (2006.01)
*G03F 7/00* (2006.01)
*G03F 7/26* (2006.01)

(52) U.S. Cl.
USPC .............. 430/302; 430/270.1; 430/284.1; 430/309; 101/453; 101/463.1

(58) Field of Classification Search
USPC ................... 430/302; 101/453, 463.1
See application file for complete search history.

(56) References Cited

U.S. PATENT DOCUMENTS

| 5,091,287 | A | * | 2/1992 | Dustin | 430/302 |
| 5,223,041 | A | * | 6/1993 | Cerney | 134/15 |
| 6,935,237 | B2 | * | 8/2005 | Higashi | 101/463.1 |
| 2003/0118944 | A1 | | 6/2003 | Copeland et al. | 430/302 |
| 2008/0311525 | A1 | * | 12/2008 | Gries et al. | 430/309 |
| 2010/0212522 | A1 | * | 8/2010 | Fromson et al. | 101/141 |

* cited by examiner

*Primary Examiner* — Chanceity Robinson
(74) *Attorney, Agent, or Firm* — Alix, Yale & Ristas, LLP

(57) ABSTRACT

A method for producing a printable lithographic plate from a negative working, radiation imageable plate having an oleophilic resin coating that reacts to radiation by cross linking and is non-ionically adhered to a hydrophilic substrate. Steps include imagewise radiation exposing the coating to produce an imaged plate having partially reacted image areas including unreacted coating material, and completely unreacted nonimage areas; developing the plate by removing only the unreacted, nonimage areas from the substrate while retaining unreacted material in the image areas; and blanket exposing the developed plate with a source of energy which further reacts the retained unreacted material in the image areas. A plate with a coating containing resin particles can be imaged to produce initial cross-linking, then mechanically developed. Hardening of the imaged areas is completed with a relatively intense post-heating at 160 deg. C., which further cross links the monomer and fuses the resin particles.

22 Claims, 5 Drawing Sheets

METHOD OF DEVELOPING A LITHOGRAPHIC PRINTING PLATE INCLUDING POST HEATING

RELATED APPLICATIONS

This is a continuation-in-part of U.S. application Ser. No. 12/799,568, filed Apr. 27, 2010 now U.S. Pat. No. 8,137,897 for "Processless Development of Printing Plate", which is a continuation-in-part of U.S. application Ser. No. 12/586,764 filed Sep. 28, 2009 now U.S. Pat. No. 8,133,658 for "Non-Chemical Development of Printing Plates".

BACKGROUND

The present invention relates to imageable lithographic plates for printing.

Plates of interest have a solvent-soluble, radiation-polymerizable, oleophilic resin coating on a hydrophilic substrate. In conventional practice, after image-wise exposure at ultraviolet (UV), visible, or infrared (IR) wavelengths, the plates are developed with solvent to remove the unexposed areas of the coating by dissolution, thereby producing a substantially planographic pattern of oleophilic and hydrophilic areas. The developed plates are then ready for mounting on a cylinder of a printing press, where the plates are subjected to fountain fluid and ink for transfer of ink to a target surface according to the pattern of oleophilic and hydrophilic areas on the plate.

The imaging radiation produces a cross-linking reaction in the imaged areas, which increases the mechanical adhesion of the image areas to the grained surface of the substrate, and also increases the cohesion (hardening) of the image area so that it can withstand the abrasive effect of receiving and transferring ink during the production run on-press. It is known that the hardness of the image areas can be increased by preheating the plate (i.e., before exposure to imaging radiation), but this must be done at a relatively low temperature such as 105° C., for a relatively short period of time (such as one minute) because the entire coating experiences a modest degree of cross-linking. If the temperature and/or time of preheat exceed a relatively low threshold, the cross-linking of the entire coating will degrade the chemical processing, which will not completely remove all of the non-image areas from the substrate. On the other hand, the less the intensity of the preheat, the more likely some of the material in the image areas will not cross-link and therefore dissolve during the development step.

Regardless of how manufacturers and end users make this tradeoff, in conventional solvent based development of negative, actinically imageable lithographic plates, no further cross-linking can be achieved in the image areas after development of the plate in the solvent. Any coating material in the image areas that did not react with the radiation, is dissolved and therefore removed from the image areas during the development step.

With development using only mechanical forces, as described in co-pending U.S. application Ser. No. 12/799,568 and Ser. No. 12/586,764 (the disclosures of which are hereby incorporated by reference), preheating was disclosed as a desirable option, but also performed at a modest level of intensity so as not to cross-link the unimaged areas to the extent that the mechanical forces cannot remove the nonimage areas during development. The plates are heated after imaging but before development to increase the difference in cohesion and adhesion of the coating to the substrate as between the imaged and unimaged areas, such that a greater force can be applied to the plates to dislodge only the unimaged areas. In particular, a thermally imageable negative working plate can be exposed to heat for a short period of time after imaging, whereby the imaged portions become more stable and tougher, while the portions of the coating that are to be removed are not significantly affected. The heating step preferably, but not necessarily, immediately follows the imaging step, but can be at a different location from the imaging step. The mechanical development of imaged plates has numerous advantages over known techniques that rely on solubilization or dispersion for removal of the unimaged areas. These advantages include retention of the full integrity of the imaged areas, avoiding the handling of chemical waste product, and the option of developing either prepress or on-press. Moreover, with on-press mechanical development, neither the ink nor fountain solution is contaminated by solubilized material that can affect the quality of the printing.

SUMMARY

The present inventors have recognized another implication of mechanical development, whereby the cross-linking in the image areas can be maximized with a more intense application of external energy, preferably heating, without adversely affecting the ability to cleanly remove the unimaged areas. This is achieved by post-heating the plate, i.e., a more intense blanket heating or other cross linking promoter is performed when only the imaged areas are on the plate. This post-heating increases the hardness of the image areas because, unlike with chemical development, unreacted material remains in the image areas even after development is complete, so that post-heating produces additional, if not maximum, cross-linking.

The disclosed method achieves the remarkable combination of significantly reducing the imaging time, increasing the resolution, and increasing the hardness and thus on-press life of the printable plate.

These advantages are achieved by shifting a large fraction of the cross-linking, from the imaging step to the post-heating step. Because no unimaged coating material is on the substrate after development, while the imaged areas on the substrate contain a significant unimaged content, there is practically no limit to the intensity of heat that can be beneficially applied to the developed plate.

Moreover, if the imageable plate has a coating containing an undissolved resin distributed in a polymerizable monomer and/or oligomer, the post heating can be performed at or above the glass transition temperature of the resin. The resin fuses, preferably as a network throughout the polymerized material, thereby further enhancing the strength and press life of the oleophilic areas.

Preferably, the imaging radiation is slightly above the minimum level that provides sufficient cross-linking to prevent removal of the imaged areas during mechanical development. Post-heating is then relied on to maximize the cross-linking and thereby achieve improved plate life on-press. For example, conventional infrared (IR) imaging energy is about 125 mj/cm$^2$, after preheating at 102° C. For a commercial implementation of the present method, imaging can be achieved at up to three or more times the speed, i.e., in the range of about 80-40 mj/cm$^2$, with post-heating only so long as is needed to raise the temperature of the coating to at least 125° C., and preferably to the transition temperature of the resin, such as 160° C. The per cent of cross linking resulting from the post-heating should be greater than the per cent of cross linking from the imaging radiation.

Imaging at this much lower energy level has another advantage beyond increased production speed. Imaging at a relatively high but common resolution of 2400 dpi at 200 lines per inch requires that each "dot" or "pixel" of imaged coating have the desired area as imaged and that the surrounding unimaged material be cleaned out. The use of the common energy level of 125 mj/cm$^2$, can produce "fat dots" in which coating material surrounding the nominal area of dot exposed to the radiation, experiences residual or ancillary cross-linking at the edge of the dot, thereby degrading the resolution. At less than 100 mj/cm$^2$, especially at 70 mj/cm$^2$, resolution degradation due to fat dots is negligible, if not avoided all together.

Whereas conventional negative working plates developed via solubilization or dispersion provide up to several hundred thousand impressions on-press, the plates manufactured according to the presently disclosed method easily achieve in excess of 500,000 impressions on-press. This combination of high resolution and high impression capability, permit the present method to compete with lithographic printing using positive working plates.

Post-heating of positive plates is known, to enhance the change of state that occurs with the heating of phenolic resins. The inventors are not aware of post-heating for any type of actinic, negative working plate. In particular, we are not aware of any post-heating to increase the cross-linking in the image regions.

In one general aspect, the invention is directed to a method for producing a printable lithographic plate from a negative working, radiation imageable plate having an oleophilic resin coating that reacts to radiation by cross linking and is non-ionically adhered to a hydrophilic substrate, comprising imagewise radiation exposing the coating to produce an imaged plate having partially reacted image areas including unreacted coating material, and completely unreacted nonimage areas; developing the plate by removing at least 95% and up to 99% of the unreacted, nonimage areas from the substrate while retaining unreacted material in the image areas; and blanket exposing the developed plate with a source of energy which further reacts the image areas.

The plate is preferably developed by removing the nonimage areas from the substrate without dissolution or dispersion of any of the nonimage and image areas, but the advantages over previously known techniques are achievable in a practical implementation even if the coating experiences minor, incidental dissolution or dispersion.

Preferably the plate is developed by application of mechanical force on all the coating to mechanically dislodge only the nonimage areas as particles from the substrate without dissolution or dispersion of any coating material, such that the integrity of the image areas remains intact. With this preference method, the nominal coating weight is retained in the image areas through completion of the blanket exposure.

The preferred plate as imaged comprises (i) a substrate with a grained, anodized, hydrophilic surface and (ii) a negative working, organic, polymerizable coating in which all active components for polymerization are not soluble or dispersible in any of water, fountain solution, ink or similar fluids. The coating is non-ionically bonded to the substrate and is cross-linked by polymerization in areas exposed to radiation. In the plate as manufactured, the cohesion of the unimaged areas of the coating exceeds the adhesion of the unimaged areas of the coating to the substrate. After imaging, the entire coating is subjected to mechanical forces, preferably while the coating is in contact with a flushing fluid such as water, which forces disrupt and remove only the unimaged areas of the coating from the substrate surface in the form of particulate material, without dissolving or dispersing the unimaged areas of the coating into the fluid at the substrate surface. The fracturing phenomenon of the imaged organic film is possible because the adhesion of the as-coated unimaged organic film to the substrate is less than the internal cohesion of the imaged film.

In this context, "active" means an ingredient that participates in the radiation induced polymerization in the imaged areas. This generally means the active ingredients are a polymer, a monomer and/or oligomer, at least one polymerization or cross link initiator, and a dye.

Practitioners in this field had no reason to investigate or optimize the difference in adhesion of solvent-soluble resins as a basis for non-chemical, and especially mechanical, removal of the nonimage areas. Because it was the established practice that nonimage areas of the imaged plate could be substantially completely dissolved by the chemical reactions with the developer solution, the main objective for improving coatings has been to increase the adhesion, cohesion, and durability of the imaged areas and thereby enable the plate to better withstand the rigors of the printing press. Any desired relationship between the imaged and unimaged areas was based on relative solubility, not relative mechanical adhesion, to minimize incidental dissolution of any of the exposed surface the imaged areas while the developer solution dissolved substantially all of the non image areas.

DESCRIPTION OF THE PREFERRED EMBODIMENTS

Printing Press Process

Figure 1:
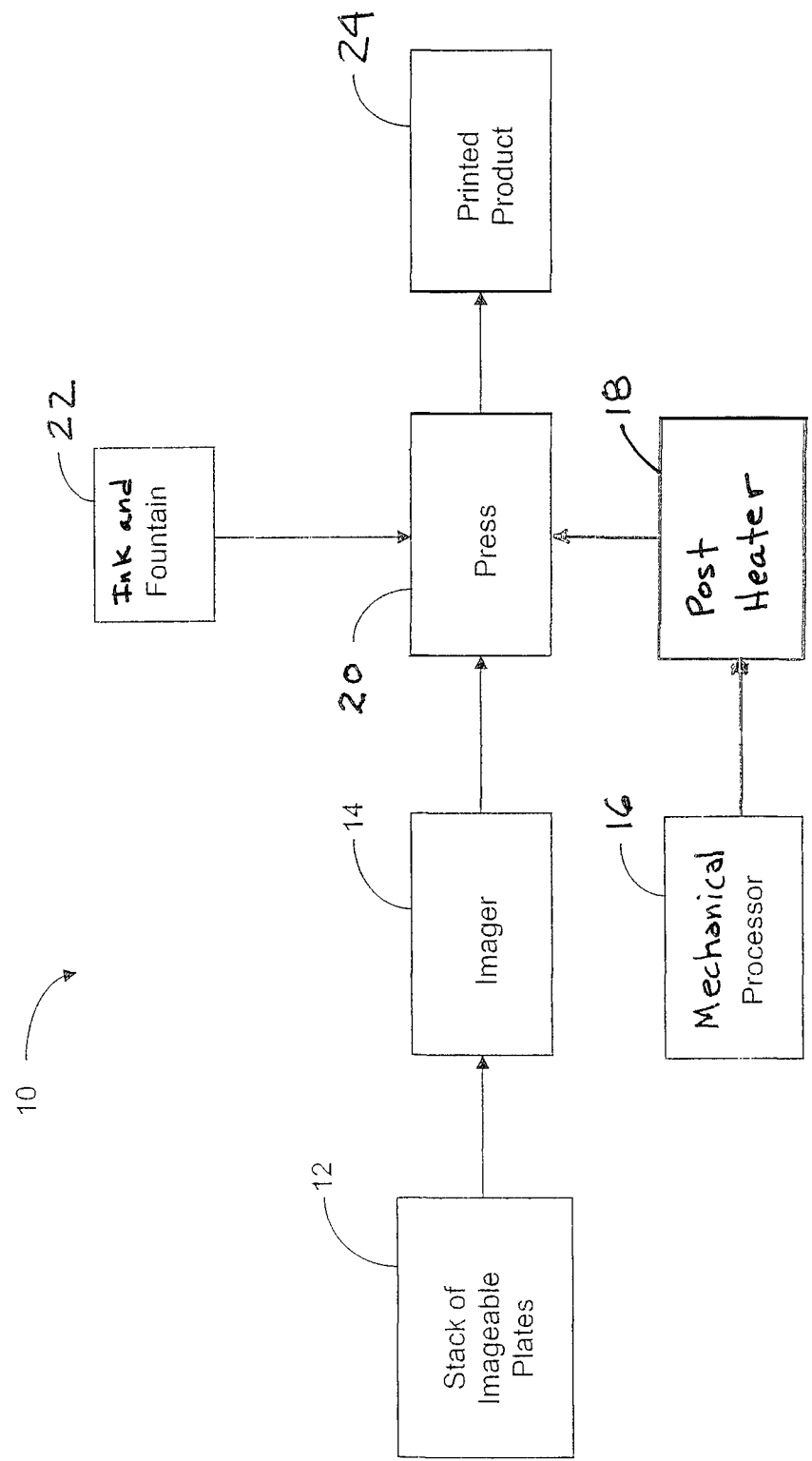
FIG. 1 schematically shows a printing system comprising plate stack, imager, and press.

FIG. 1 shows a schematic of a printing plant 10, such as for newspaper printing, in which a stack of radiation imageable plates 12 is situated upstream of an imager 14, where the coating on the plates is selectively highly cross linked by selective exposure to radiation to form a pattern of highly cohesive and adhesive areas, and areas that exhibit less cohesion and adhesion. The plate substrate is hydrophilic, whereas the coating is oleophilic The radiation exposure produces high internal cohesion, and high adhesion to the plate. In a conventional negative working system, the original (unimaged) coating is soluble in a specified developer solvent, so the imaged plate must be developed with such solvent to remove the non-exposed areas and thus produce a plate usable in the press. The developer solutions most frequently used contain either some amount of an organic solvent (typically benzyl alcohol) or have an elevated pH (alkaline).

The imaged plates are transferred to a mechanical processor 16, in which the non-imaged areas are removed by mechanical impingement of the coating with resulting dislodgment and removal. The energy level of the imaging at 14 is selected such that the imaged areas are only partially reacted, i.e., the imaged plate has partially reacted image areas including unreacted coating material, whereas the non-image areas are completely unreacted, i.e., they have not been affected by the radiation. The mechanical impingement removes only the unreacted non-image areas from the substrate while retaining all of the unreacted material in the image areas. The mechanically developed plates are then delivered to a post-heating unit 18 where blanket heating of the plate from an external source of energy further reacts the image areas, thereby increasing the cross linking within the image areas.

Tables A and B show data that was obtained by varying the imaging energy, the blanket heating energy temperature after imaging, and the rate of travel of the plate at a given temperature.

TABLE A

| PLATE # | BLANKET IR (mj/cm2) | POST HEAT TEMP (deg. C.) | POST HEAT RATE (ft/min) | AVG. COLOR VALUE LOSS (%) |
|---|---|---|---|---|
| 1 | 50 | 160 | 4 | 21 |
| 2 | 50 | None | None | 74 |

TABLE B

| PLATE # | BLANKET IR (mj/cm2) | PRE HEAT TEMP (deg C._) | POST HEAT TEMP (deg. C.) | COLOR VALUE LOSS (%) | PLATE AVG LOSS |
|---|---|---|---|---|---|
| 3 | 100 | NONE | NONE | 33 | |
|   | 120 | NONE | NONE | 28 | |
|   | 140 | NONE | NONE | 23 | |
|   | 160 | NONE | NONE | 21 | |
|   |     |      |      |    | 26 |
| 4 | 100 | 105 | NONE | 32 | |
|   | 120 | 105 | NONE | 18 | |
|   | 140 | 105 | NONE | 11 | |
|   | 160 | 105 | NONE | 9 | |
|   |     |     |      |   | 17 |
| 5 | 100 | NONE | 160 | 9 | |
|   | 120 | NONE | 160 | 6 | |
|   | 140 | NONE | 160 | 6 | |
|   | 160 | NONE | 160 | 5 | 6 |

In Table A, both samples were imaged at 50 mj/cm$^2$, one with post-heating at 160° at a throughput of 4 feet per minute, whereas the other was not post-heated. The plates as imaged and post-heated were rubbed with a cotton swab with benzyl alcohol for 100 double rubs. For imaging at a dot density of 80, 90 and 100, the average percent color value loss for the post-heated plate was 21% whereas the average loss for the non-post heated plate was 74% Table A shows that post heating increases durability significantly relative to no post-heating for plates that were imaged at low energy and developed mechanically.

Table B shows that at the relatively low heating temperature (105° C.) used in conventional preheat of negative working plates, the higher the imaging energy level the lower the color value loss (Plate #4). The improvement in the average color change relative to no pre or post heating (Plate #3) only went from 26% without post-heat to 17% with post-heat over the range of 100-160 mj/cm$^2$. However, with a post-heat temperature of 160° (Plate #5), the average percent loss over the same energy exposure range is only 6%. Moreover, energy of only 100 mj/cm$^2$ and 160° post heat temperature produces the same loss as energy exposure of 160 mj/cm$^2$, at 105° preheat temperature (i.e., 9%).

The conclusion to be drawn is that the capability of post-heating at high temperature produces significantly enhanced cross-linking. The average at 160° post-heat verses no post-heating is a four-fold improvement from 26% loss to 6% loss. Relative to post-heating at conventional temperature of 105°, post heating at 160° shows approximately a three-fold improvement, from 17% to 6% loss.

Imageable Plate

Figure 2:
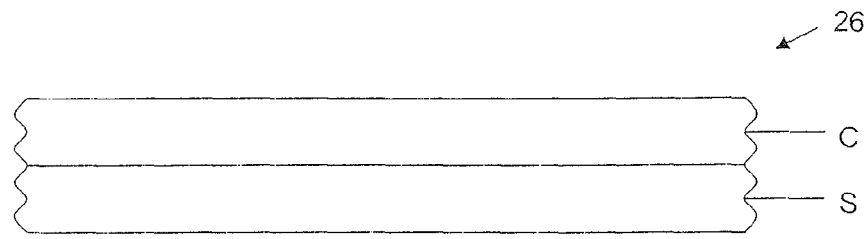
FIG. 2 is a schematic plate cross section showing an imageable coating directly supported on a substrate.

FIGS. 2-6 illustrate schematically, the physical attributes of a plate according to the present invention. FIG. 2 is a schematic section view of the basic embodiment 26, consisting of a substrate or carrier S on which an organic, non-aqueous solvent-based coating C has been applied and dried. The substrate S is preferably a grained, anodized aluminum sheet. The substrate is preferably post treated with a hydrophilizing agent prior to coating. Such post treatments are well known in the art, and include silicate solutions, polyvinylphosphonic acid (PUPA) or amino trimethylenephosphonic acid (ATMPA). The coating C is applied from a solvent soluble composition comprising one or more components capable of cross linking by free radical polymerization. The polymerization arises as a result of imaging with ultraviolet, visible or infrared radiation. As such, the coating may further comprise radiation absorbers and/or initiators to facilitate the cross linking efficiency. None of these active components is soluble in water. Preferred coating compositions further comprise a polymeric material to enhance the oleophilicity and durability of the coating in the ink receptive printing areas.

Figure 3:
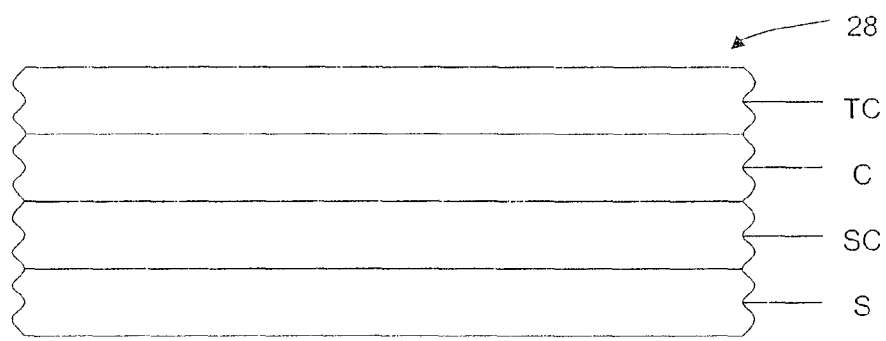
FIG. 3 is a schematic plate cross section showing an imageable plate with a subcoat and top coat.

FIG. 3 is a schematic section view of a plate 28 according to an alternative embodiment where a subcoat SC has been applied to the substrate S, the imageable coating C is applied over the subcoat, and a topcoat TC is applied over the imageable coating. The top coat TC is typically a water soluble film forming layer such as polyvinyl alcohol (PVOH) that serves to prevent atmospheric oxygen from diffusing into the coating and quenching the free radicals. Without the topcoat, the polymerization efficiency is dramatically decreased. The subcoat SC is a water soluble material that facilitates the release of the coating from the substrate in the unimaged areas. The subcoat SC must not adversely impact the adhesion of the coating to the substrate in the imaged areas of the coating. 4-hydroxbenzine sulfonic acid, sodium salt has been found to be particularly suitable as a subcoat.

Figure 4:
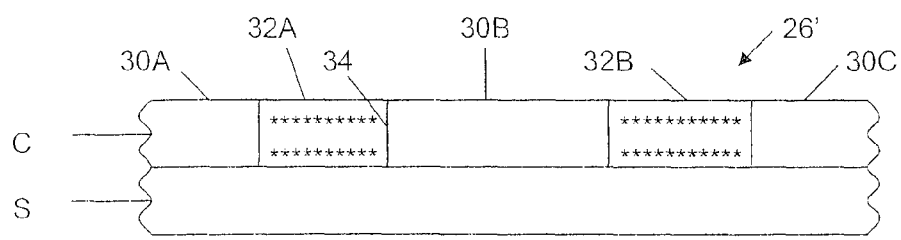
FIG. 4 is a schematic plate cross section upon exposure to radiation.

FIG. 4 corresponds to FIG. 2, and illustrates the effect 26' on the coating of exposure to imaging radiation. The radiation source is preferably a digitally controlled laser, which produces exposure pixels such that a pattern of unexposed coating 30a, 30b, and 30c and exposed coating 32a and 32b covers substantially all of the plate. However, any of the sources of incident imaging radiation used in the art to form selectively written surfaces can be used. The selective imaging results in relatively distinct boundaries 34 at the interface between the imaged and unimaged areas. It should be appreciated that the Figures are not to scale, especially as to relative thickness of the coating and substrate, but are merely illustrative. For the illustrated negative working plate, the exposed coating in areas 32a, 32b becomes highly cross linked, thereby creating areas that have sufficient cohesion and adhesion such that they are not removable by subjecting these areas to substantial mechanical forces or pressure. The unexposed areas 30a, 30b, and 30c retain the original characteristics and properties of the dried coating before imaging. This material is not highly cross linked, and lacks the adhesion to withstand substantial mechanical forces or pressure.

Figure 5:
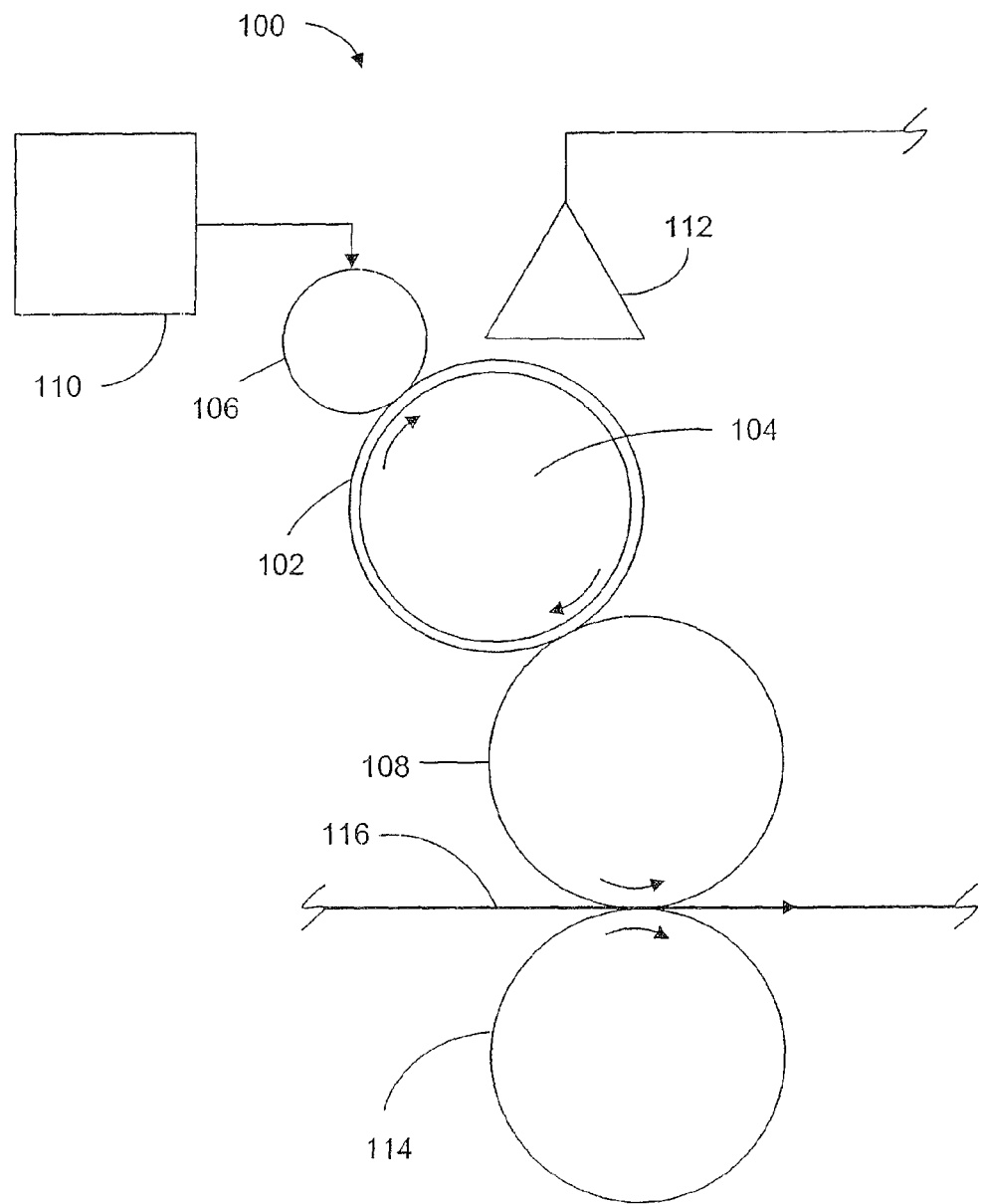
FIG. 5 is a schematic of on-press development of an imaged plate.

FIG. 5 illustrates the context of development on press 100. The imaged plate 102 has been mounted to a plate cylinder 104 in contact opposition to an ink form roll 106 and a blanket roll 108. The ink roll is generally made of rubber and the ink is generally supplied to the ink roll from a source 110 as an emulsion of water in a continuous ink medium. A fountain fluid distributor 112 is provided for the plate cylinder 104 and a rubber roll 114 is in opposition to the blanket roll 108.

Figure 6:
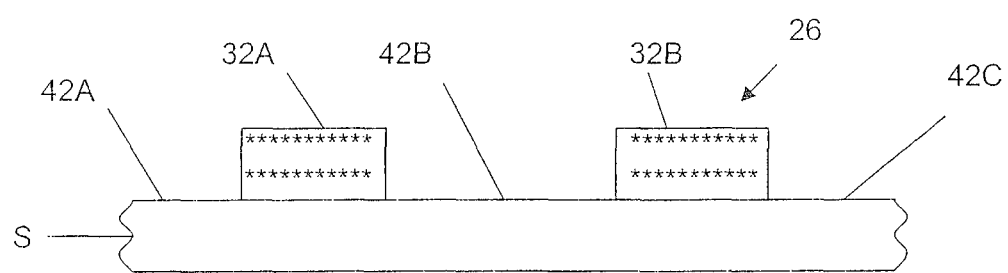
FIG. 6 is a schematic plate cross section showing the pattern of remaining oleophilic imaged areas of the coating and the hydrophilic substrate surface areas where the unimaged areas have been removed in solidus.

FIG. 6 shows a portion of the resulting plate 26 (flattened for convenience) ready for production runs with areas 32a and 32b representing the oleophilic coating areas that pick up ink and 42a, 42b, and 42c representing the hydrophilic substrate surfaces that carry the fountain fluid. It is to be understood that the plates and process described herein are essentially planographic and, as noted above, the relative thickness of the areas and surfaces shown in the figures should not be considered as in scale.

Figure 7:
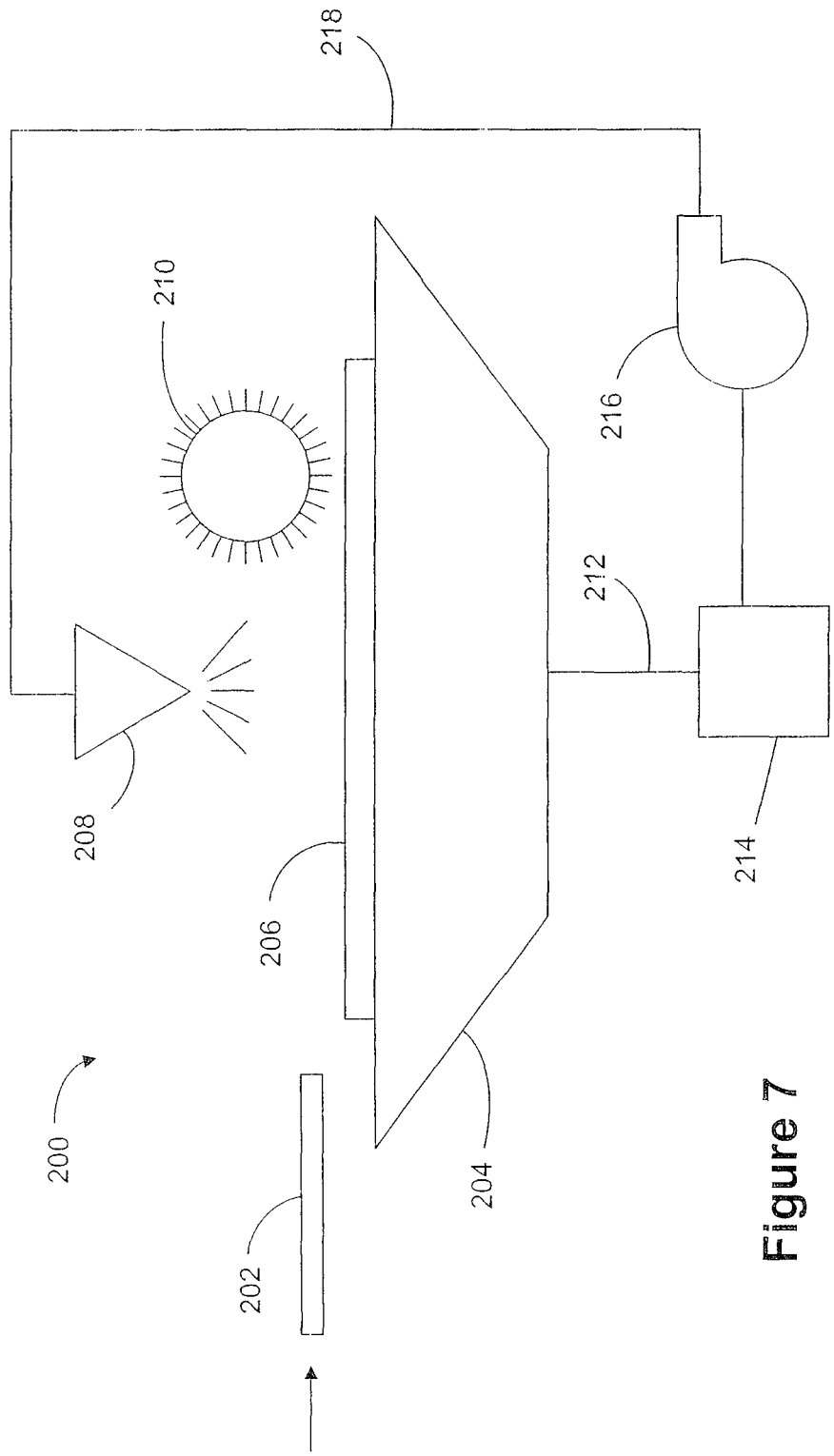
FIG. 7 is a schematic of one embodiment of a pre-press water processor.

FIG. 7 is a schematic of the operative components of one possible processor 200 for the pre-press mechanical development of an imaged plate in a system as depicted in FIG. 1 (where the mechanical processor is indicated at 16). The imaged plate 202 is conveyed over a basin or tank 204 onto a platen 206 or the like. Water is sprayed 208 on the plate surface and a coarse rotary brush 210 in combination with water at any pressure or flow rate provides all or additional impingement on the coating surface. The overflowing water with removed particles is captured in the basin or sump 204 and continuously drained and delivered via line 212 to particle filter 214. The filtered water is recirculated back to the spray nozzle 218 by pump 216 and return line 218. The resinous material removed as particles is trapped in the filter, so there is little or no chemical treatment required of the waste stream associated with developing the plate.

Significant advantage of the present invention is that the integrity of the imaged coating is not adversely affected by the processing liquid, i.e., water or fountain fluid. For conventional plates, the imaging process causes a change in the solubility of the coating in the developer. The change is never 100% efficient; that is, even the imaged coating will have some level of solubility in the developer. This residual solubility may significantly alter the adhesive and/or cohesive integrity of the coating. The present invention does not suffer from this problem. The coating weight of the imaged areas is not affected by development.

Coating of Representative Embodiment

In one particular embodiment of the invention having the basic configuration shown in FIG. 2, the coating comprises from about 5 to about 30 wt % based on solids content, of a polymer that is generally considered by practitioners of applied chemistry, as insoluble in water. The polymer material may be selected from a wide range of types such as but not limited to acrylates (especially urethane acylates), siloxanes, and styrene maleic anhydrides.

Advantageously, the coating comprises from about 35 to about 75 wt % based on solids content, of a polymerizable monomer, a polymerizable oligomer, or combination thereof that is similarly insoluble in water. Some suitable radically polymerizable (cross linkable) materials are a multifunctional acrylate such as Sartomer 399 and Sartomer 295 commercially available from Sartomer Co.

The coating comprises a non-water-soluble initiator system capable of initiating a polymerization reaction upon exposure to imaging radiation. Some suitable initiator systems comprise a free radical generator such as a triazine or an onium salt.

Optionally but not necessarily, the coating comprises from about 5 to about 15 wt % based on solids content of an organic compound that is soluble in organic solvents and only partially soluble in water. This option may be used when the plates are developed with water pre-press, especially if no brushing is performed. Some suitable compounds include a substituted aromatic compound, such as DTTDA (an allyl amide derived from tartaric acid) and tetra methyl tartaramide. The water solubility must not be so great as to overcome the hardening of the imaged areas and compromise the ability of these areas to remain on the plate in the presence a high pressure water spray The water solubility should be sufficient to facilitate the penetration of water through the unimaged areas.

Additional optional components include dyes that absorb the imaging radiation (e.g. infrared absorbing dyes) and pigments or dyes that serve as colorants in the coating.

The coating can include a release agent such as 4-hydroxybenzene sulfonic acid, sodium salt 4-HBSA, 4-hydroxybenzoic acid or sodium benzoate. In a different embodiment the release agent is disposed as a sub-coating between the hydrophilic substrate and the imageable coating.

With the preferred implementation of the invention whereby imaging is performed at a relatively low energy, e.g., below 100 mj/cm$^2$, mechanical development can clean out non-imaged material to a level approaching 100%, because less than about 50% of the ultimate (post heat) cross linking occurred during imaging. Even relatively coarse brushes with flushing water can remove unimaged material even at the edges of the dots and, furthermore, there is little if any undesirable cross linking of coating material immediately surrounding the nominally exposed pixel due to avoidance of the "fat dot" effect.

There are many types of resins, oligomers and monomers that can be used to produce coatings that would have properties suitable for use in the present invention. It is believed that the monomer to polymer ratio in the range of 2-4 and the use of an organo-borate catalyst with an onium salt catalyst are important preferences. A wide mixture of functionalities can be used but dried coatings with better adhesion and cohesion are achieved with multi functional monomers and oligomers (functionality of 3 or higher). It is not necessary to use a resin which contains unsaturated groups but in the majority of the cases the cured film will exhibit better adhesion and integrity. Types of resins can include poly vinyls (poly vinyl acetate, poly vinyl butyral, etc), cellulosic, epoxies, acrylics and others as long as the resin does not produce a strong adhesive bond with the substrate. Monomers and oligomers should be somewhat viscous liquids and can be polyester/polyether, epoxy, urethane acrylates or methacrylates (such as polyether acrylate, polyester acrylate, modified epoxy acrylate, aliphatic urethane methacrylate, aliphatic urethane acrylate oligomers, polyester acrylate oligomers, aromatic urethane acrylate, dipentaerythritol pentaacrylate, pentaacrylate ester, etc.).

TABLE D

Radiation Sensitive Coatings Without Water Soluble Components

| | Formulations | | |
|---|---|---|---|
| Ingredients | #1 | #2 | #3 |
| PGME | 94.990 | 94.990 | 94.990 |
| Poly 123 | 1.500 | — | — |
| Bayhydrol 2280 | — | 1.500 | — |
| ACA Z250 | — | — | 1.500 |
| Sartomer 399 | 1.750 | 1.500 | 2.000 |
| Sartomer 454 | 0.250 | 0.250 | — |

TABLE D-continued

Radiation Sensitive Coatings Without Water Soluble Components

| | Formulations | | |
|---|---|---|---|
| Ingredients | #1 | #2 | #3 |
| Sartomer 355 | — | 0.250 | — |
| IRT thermal Dye | 0.150 | 0.150 | 0.150 |
| Penn Color | 0.350 | 0.350 | 0.350 |
| HOINPO2 | 0.400 | 0.350 | 0.050 |
| Showa-Denko P3B | — | 0.050 | 0.350 |
| Phenothiazine | 0.010 | 0.010 | 0.010 |
| Showa-Denko 2074 | 0.600 | 0.600 | 0.600 |
| TOTAL | 100.00 | 100.00 | 100.00 |

Formulations #1, #2 and #3 are examples of radiation curable coatings that contain no water soluble or water dispersible ingredients. Formulations #1-3 are consistent with the preferred implementation of the present invention, to the effect that a wide range of ingredients can be used in order to produce a lithographic printing that can be developed using only a mechanical force applied to the coating, without reliance on dissolution or dispersion of the coating in water (e.g., fountain fluid) or press ink.

All plates having coating formulations #1-3 are comprised of a substrate with a hydrophilic surface and a very oleophilic radiation sensitive layer, but the mode of development of coating formulations #1-3 relies strictly on the adhesive and cohesive properties of the coating. These coatings as applied and prior to imaging exposure have better cohesive strength than adhesive strength. The adhesive strength of the ink to the non imaged coating is greater then the adhesive strength of the coating to the substrate. When the coating is exposed to radiation it undergoes polymerization which greatly amplifies its adhesive and cohesive strengths. The unexposed coating has weaker adhesion to the substrate and weaker cohesion to itself than that of the press inks. The higher surface energy of these coatings allows the press ink to adhere very strongly. This strong adhesion along with its greater cohesive strength allows the ink to delaminate the coating from the plate surface.

The following list of representative ingredients will enable practitioners in this field to formulate coating compositions that are adapted to a meet targeted performance that balance cost of ingredients, coating process control, shelf life, range of imaging radiation wavelength, type or types of mechanical forces to be used for development, type of fountain and ink on press, and ease of achieving target resolution. For commercial purposes additional, non-active water insoluble ingredients can be included such as viscosity agents for facilitating coating of the plate, shelf life stabilizers, and agents for reducing any tendency for removed coating particles to build up in, e.g., a water and rotary brush processor. In variations not shown in Table D, the solvent can be Arcosolve PM, DMF, and MEK, non-active stabilizers, pigments and the like can include Karenz PE1 and 2951657 as well as the ACA Z 250. Urethane acrylate resins with active ingredients similar to formulation #2 and various water-insoluble inactive ingredients are presently preferred.

The currently favored prototype coating is shown in Table E.

TABLE E

| COMPONENT | % BY WEIGHT |
|---|---|
| Arcosolv PM[1] | 78.0347 |
| DMF[1] | 6.8159 |
| MEK[1] | |
| 1% Ciba Geigy UV-10 in DMF[2] | 0.1900 |
| Showa Denko P3B[3] | 0.0650 |
| HOINTPO2[4] | 0.1500 |
| IRT Thermal Dye[5] | 0.1152 |
| Secant/Rhodia 2074[6] | 0.4116 |
| 40% SR-399 in PM[7] | 07.2145 |
| 29S1657[8] | 4.6132 |
| Bayhydrol 2280[9] | 2.3900 |
| Total | 100.0000 |

[1]Solvent
[2]Stabilizer
[3]Initiator
[4]Initiator
[5]IR absorbing dye
[6]Initiator
[7]Monomer
[8]Pigment dispersion
[9]Polymer Binder (Resin)

In the most preferred embodiment, the resin does not dissolve in the monomer. This can be a result of different solubility levels of the monomer and resin in the solvent system of the coating as formulated for deposition on the substrate. It is believed that as the coating is dried, and the water and solvent expelled, the resin remains in finely entrained particles of less than 40 nm effective diameter. Depending on the resin, it may or may not have sites that cross-link during imagewise exposure of the plate. However, according to the invention, only a partial cross-linking of the photosensitive layer is desired during the imaging step with the balance, preferably the majority, of cross-linking occurring during post heating. If the post heating is performed at the glass transition temperature of the resin, it is believed that the particles are closely enough distributed that they can fuse with one another, creating a network or web which further enhances the strength of the oleophilic areas that will perform the print image on press. Because such fusion occurs only in the image areas after the non-image areas have been removed, the fusion does not increase the dot or pixel size.

It is also possible that the presence of the resin as distributed, undissolved particulates in the dry coating may also contribute to the desirable characteristic of the coating that the cohesion of the coating is greater than the adhesion of the coating to the substrate, and the corollary that the unimaged areas of the coating can be removed in particulate form at the surface of the substrate, without dissolution or dispersion at the surface of the substrate.

Thus, the selection of a resin relative to the monomer/oligomer solution, presents a design variable for optimizing the combination of imaging exposure, type and intensity of mechanical development, and post heating temperature, to achieve a target combination of process speed, image resolution, and plate-life on press.

It should be appreciated that any form of particle can be incorporated into the dry coating for optimizing the cohesion and adhesion characteristics. Ideally the resin provided both functions of adhesion and cohesion optimization as well as post-heating fusion, but a combination of resin particles and other solid particles can be employed. However, in the most basic embodiment fusion of the resin is not relied on, because the post heating alone increases the cross linking of the monomer well beyond the cross linking resulting from the imaging radiation.

The same coated plate product can be used for (a) mechanical development with or without preheat followed by on press clean out, (b) mechanical development with full cleanout, post-heat and printing, or (c) full development on press.

Mechanical development is preferably achieved with relatively stiff, coarse, rotating brushes in a water environment such as the Agfa Azura wash out unit or the Proteck XPH 85 HD processor. Both machines use two relatively stiff, coarse brushes supported by a platen and have spray bars that deliver a wash out gum solution to the plate. The wash out solution is allowed to flow over the plate and then run back into the sump that is located below the machines. The solution is kept at about 70-100 deg. F. in the sump. The basic wash out gum solution contains water soluble resins, anionic surfactants, nonionic surfactants and silica. The components of the wash out solution serve two purposes. First, they help prevent the particles of coating that are removed by the brushes from sticking to each other or any surfaces that they encounter. Second, they serve as a finisher on the plates to protect against fingerprints and heat.

Mechanical development for plates imaged above 100 mj/cm$^2$ with brushes and this basic wash out solution will clean out up to about 97% or 98% of unimaged material, which is quite adequate for newspaper printing. However, if the plates are to be used for commercial or other high quality jobs, cleanout must approach 100% before post heating.

To achieve this level of cleanout, residual unimaged material at the base of the image dots can be removed by the action of one or two additional, non ionic surfactants that have high HLB values. As a practical matter, the surfactant molecule has one end that has an affinity to water and another end that has an affinity to the oleophilic coating, so the action of the brushes and water turbulence removes the residual coating as if by pulling it off the substrate (as distinguished from dissolving the residual coating).

Increased cleanout can also be achieved only with brushes and normal water if the brush impact duration is extended by decreasing the throughput rate.

If the coating includes a partially water soluble compound, the water penetrates the unimaged coating to the substrate whereby the coating separates from the substrate in particulate form with less mechanical action (spray or brushes) than in the preferred embodiment. As in all embodiments, the imaged areas have been exposed to sufficient energy to enhance the adhesion to the substrate and the internal cohesion and thereby resist removal during development. This enhancement in the image areas minimizes the penetration of water due to the presence of the partially water soluble compound. Even if some of the material in the image areas is lost during development, enough partially cross linked material remains such that the additional cross linking reactions during post heating provide the desired advantages.

The invention can be practiced even if the coating resin is partially dissolved during development so long as enough unreacted material remains so that the post heating produces greater durability than conventional pre heat and chemical development.

Table F shows that over a wide range of imaging energy, the hardening of the imaged areas is predominantly dependent on the post heating energy. Thus, one can obtain the advantage of imaging at a low energy/high speed (e.g. 40 to 80-mj), while easily achieving higher durability using post heat temperatures (e.g., 160 C) well above the practical pre-heat limit of 105 deg. C. The table shows that 40 mj imaging with 160 C post heat produces higher cross linking (50% vs. 40%) and much more plate life (1.76% vs. 5.08% color loss) than imaging at 200 mj without pre or post heat. The table also shows that initial radiation imaging at 40 mj or 80 mj, produces 16% and 24% cross linking, respectively. Post heating increases the cross linking to 50% and 52% respectively. It can thus be appreciated that in the preferred embodiment, IR imaging at under 100 mj followed by post heating at 160 deg. C. is very effective.

TABLE F

| | IR IMAGING INTENSITY | | | | |
|---|---|---|---|---|---|
| | 200 mj | 160 mj | 120 mj | 80 mj | 40 mj |
| Post Heat @160 C. | | | | | |
| % Color Loss | 0.04 | 0.67 | 1.02 | 1.37 | 1.76 |
| % Cross Linked | 56 | 55 | 55 | 52 | 50 |
| No Pre or Post Heat | | | | | |
| % Color Loss | 5.08 | 6.76 | 9.23 | 13.93 | 31.72 |
| % Cross Linked | 40 | 40 | 35 | 24 | 16 |

The following Table G shows the additional advantage that imaging with low energy and high post heating temperature also achieves higher resolution.

TABLE G

| | MEASURED RESOLUTION @ 2400 dpi (%) | | | | | |
|---|---|---|---|---|---|---|
| IR ENERGY (mj) | 200 | 200 | 200 | 40 | 40 | 40 |
| HEATING | NONE | PRE | POST | NONE | PRE | POST |
| TEMP (deg. C.) | NONE | 105 | 160 | NONE | 105 | 160 |
| TARGET % RESOLUTION @2400 dpi | | | | | | |
| 1 | 2.2 | 2.1 | 2.3 | 1.2 | 1.3 | 1.0 |
| 2 | 3.9 | 4.3 | 4.5 | 2.3 | 2.8 | 2.2 |
| 3 | 6.6 | 8.7 | 6.4 | 3.3 | 4.1 | 3.7 |
| 4 | 8.4 | 10.0 | 9.3 | 5.4 | 6.8 | 5.8 |
| 5 | 11.8 | 11.9 | 10.5 | 6.2 | 7.9 | 6.4 |
| 10 | 18.4 | 22.5 | 18.7 | 11.6 | 13.6 | 11.3 |
| 30 | 41.8 | 72.3 | 62.6 | 33.7 | 35.1 | 31.8 |
| 80 | 97.3 | 99.4 | 99.1 | 80.7 | 83.2 | 81.1 |
| 90 | 99.3 | 100 | 99.7 | 90.2 | 92.0 | 90.5 |
| 95 | 100 | 100 | 100 | 94.7 | 95.4 | 94.3 |
| 96 | 100 | 100 | 100 | 95.7 | 95.7 | 95.7 |
| 97 | 100 | 100 | 100 | 96.0 | 96.9 | 96.7 |
| 98 | 100 | 100 | 100 | 97.4 | 98.0 | 97.7 |
| 99 | 100 | 100 | 100 | 98.5 | 98.5 | 98.5 |
| 100 | 100 | 100 | 100 | 100 | 100 | 100 |

With imaging at 200 mj the measured resolution does not match the target resolution to commercially acceptable standards, whether or not the plate is pre or post heated. Such high imaging energy polymerizes coating material outside the footprint of radiation as it penetrates the coating, producing unwanted hardening outside the desired pixel boundary. With imaging at 40 mj, and no pre or post heating, the resolution is within commercially acceptable standards, but as discussed with respect to Table, the plate would have unacceptably low life on press. With the known method of imaging at 40 mj after pre heat at 105 deg. C., the resolution is still acceptable and the plate life would be improved relative to no heating, but not up to commercial standards. With imaging at 40 mj and post heating at 160 deg. C., the resolution is overall at least as good if not better than with either no or pre heating.

The invention claimed is:

1. A method for pre-press production of a printable lithographic plate from a negative working, radiation imageable plate having an oleophilic resin coating that reacts to radiation by cross linking and is non-ionically adhered to a hydrophilic substrate, comprising:
    imagewise radiation exposing the coating to produce an imaged plate having partially reacted image areas including unreacted coating material, and completely unreacted nonimage areas;
    developing the plate by removing only unreacted, nonimage areas of the resin coating from the substrate without dissolution of any of the resin coating while retaining unreacted material in the image areas; and
    blanket exposing the developed plate with an external source of energy which further reacts the retained unreacted material in the image areas.

2. The method of claim 1, wherein the plate has a nominal coating weight of the resin coating before developing and the image areas retain the nominal coating weight through completion of the blanket exposure.

3. The method of claim 1, wherein the plate is developed by application of mechanical force on all the coating to mechanically dislodge only the nonimage areas as particles from the substrate while the image areas remain intact.

4. The method of claim 3, wherein
    the coating is solvent soluble but not soluble or dispersible in any of water, press ink, or press fountain solution; and
    the application of mechanical force dislodges the nonimage areas as particles from the substrate without dissolution or dispersion of any of the coating material.

5. The method of claim 1, wherein
    the radiation exposure produces dot image areas in the imaged plate that have increased adhesion to the substrate and increased internal cohesion relative to the unimaged areas;
    the dot image areas have boundaries defined by the imagewise radiation exposure; and
    the increased adhesion and cohesion from the radiation exposure is sufficient to maintain the dot boundaries throughout development of the plate.

6. The method of claim 1, wherein no active ingredient in the coating is soluble in water and development is by mechanical impingement in water.

7. The method of claim 6, wherein no ingredient in the coating is soluble in water.

8. The method of claim 1, wherein the coating is sensitive to infra-red radiation, the imagewise radiation exposure is with infra-red radiation at an energy level in the range of 50-150 mj/cm2, and the blanket exposure is with thermal energy at a temperature above 120 deg. C.

9. The method of claim 1, wherein
    no ingredient in the coating is water soluble;
    the imaged plate is developed by mechanical impingement in a water environment that removes unimaged areas of the coating from the substrate as undissolved particles; and
    the water environment includes at least one surfactant for inhibiting the removed particles from agglomerating.

10. A method for pre-press development of a negative working lithographic printing plate having a radiation sensitive, oleophilic resin coating adhered to a hydrophilic substrate, comprising:
    initially exposing the coating to a pattern of radiation energy, thereby producing an imaged plate having image areas where the coating is partially cross-linked by reaction with the radiation energy and nonimage areas where the coating is unaffected by the radiation energy;
    developing the plate by removing only the nonimage areas of the coating from the substrate without chemical reaction, thereby producing a pattern of said partially cross-linked oleophilic coating in the image areas and hydrophilic substrate where the nonimage areas were removed; and
    finally exposing the developed plate to a source of energy which further reacts and cross links the image areas.

11. The method of claim 10, wherein the coating is sensitive to infra-red radiation, the initial exposure is with infra-red radiation, and the final exposure is with thermal energy.

12. The method of claim 10, wherein
    the coating on the imageable plate is non-ionically adhered to the substrate and has a cohesion that is greater than the adhesion to the substrate;
    the developing is by application of mechanical force to disrupt and dislodge the nonimage areas as particles from the substrate; and
    the initial exposure increases the adhesion of the image areas to the substrate to resist removal by the mechanical force that disrupts and dislodges the nonimage areas from the substrate.

13. The method of claim 10, wherein the imageable plate has a nominal coating weight of the resin coating and the image areas substantially retain the nominal coating weight throughout the initial exposure, development, and final exposure.

14. The method of claim 12, wherein the mechanical force is applied by a rotating brush in a water environment.

15. The method of claim 14, including distributing the particles in an environment of flowing water; filtering the particles from the water flow; and recirculating the filtered water into said water environment.

16. The method of claim 10, wherein the nonimage areas of the coating are removed from the substrate without dissolution of any of the coating.

17. The method of claim 12, wherein the nonimage areas of the coating are removed from the substrate without dissolution or dispersion of any of the coating.

18. The method of claim 12, wherein
    the coating is solvent soluble but not soluble or dispersible in any of water, press ink, or press fountain solution; and
    the application of mechanical force disrupts and dislodges all of the nonimage areas as particles from the substrate without dissolution of any of the coating material.

19. A method for pre-press development of a negative working lithographic printing plate having an oleophilic resin coating that has a cross-linking reaction to imaging radiation, is solvent soluble but not water soluble, has a nominal coating weight, a coating cohesion, and non-ionic adhesion to a hydrophilic substrate that is less than said coating cohesion, comprising:
    initially exposing the coating to a pattern of radiation energy, producing an imaged plate having image areas where the radiation energy produces an initial cross-linking reaction in the coating and thereby increases the cohesion and adhesion of the coating, and nonimage areas where the coating is unaffected by the radiation energy;
    without heating the imaged plate, developing the imaged plate in a water environment by application of mechanical force to dislodge and remove the nonimage areas as undissolved particles from the substrate, thereby producing a pattern of initially cross-linked oleophilic coating in the image areas that retain the nominal coating weight and hydrophilic substrate where the nonimage areas were removed; and finally exposing the developed plate to a blanket source of energy to produce additional cross-linking reactions in the image areas.

20. The method of claim 19, wherein:

the coating is sensitive to infra-red radiation;

the initial radiation exposure is with infra-red radiation at an energy level in the range of 50-150 mj/cm2;

the final exposure and said additional cross-linking is with thermal energy at a temperature above 120 deg. C. to produce a final cross-linking of at least 50% in the image areas.

21. The method of claim 20, wherein the initial radiation exposure is at an energy level less than 100 mj/cm2.

22. The method of claim 21, wherein the final exposure is at a temperature in the range of 120 to 160 deg. C.

* * * * *

UNITED STATES PATENT AND TRADEMARK OFFICE
CERTIFICATE OF CORRECTION

Page 1 of 1

PATENT NO. : 8,785,109 B2
APPLICATION NO. : 13/413280
DATED : July 22, 2014
INVENTOR(S) : Howard A. Fromson et al.

It is certified that error appears in the above-identified patent and that said Letters Patent is hereby corrected as shown below:

On the Title page,
Item (75), Inventors, after North Granby, CT (US) add

-- ; Brian L. Anderson, Westfield, MA (US) --

Signed and Sealed this
Twenty-ninth Day of December, 2015

Michelle K. Lee
*Director of the United States Patent and Trademark Office*